(12) United States Patent
Liu et al.

(10) Patent No.: US 7,361,603 B2
(45) Date of Patent: Apr. 22, 2008

(54) PASSIVATIVE CHEMICAL MECHANICAL POLISHING COMPOSITION FOR COPPER FILM PLANARIZATION

(75) Inventors: Jun Liu, Brookfield, CT (US); Mackenzie King, Southbury, CT (US); Michael Darsillo, Woodbury, CT (US); Karl E. Boggs, Hopewell Junction, NY (US); Jeffrey F. Roeder, Brookfield, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 11/117,274

(22) Filed: Apr. 28, 2005

(65) Prior Publication Data

US 2005/0255693 A1 Nov. 17, 2005

(51) Int. Cl.
*H01L 21/302* (2006.01)
*H01L 21/461* (2006.01)
(52) U.S. Cl. ............... 438/693; 438/692; 257/E21.304
(58) Field of Classification Search ............... 438/693, 438/692, FOR. 111; 257/E21.304
See application file for complete search history.

(56) References Cited

U.S. PATENT DOCUMENTS

| | | | |
|---|---|---|---|
| 6,184,141 B1 * | 2/2001 | Avanzino et al. ........... 438/692 |
| 6,190,237 B1 | 2/2001 | Huynh et al. | |
| 6,312,486 B1 | 11/2001 | Sandhu et al. | |
| 6,428,721 B1 | 8/2002 | Ina et al. | |
| 6,429,134 B1 * | 8/2002 | Kubota et al. ............. 438/692 |
| 6,440,186 B1 | 8/2002 | Sakai et al. | |
| 6,447,695 B1 | 9/2002 | Motonari et al. | |
| 6,638,854 B2 * | 10/2003 | Homma et al. ............. 438/633 |
| 6,656,842 B2 * | 12/2003 | Li et al. ..................... 438/691 |
| 6,805,812 B2 * | 10/2004 | Fang ......................... 252/79.1 |
| 6,811,470 B2 * | 11/2004 | Bonner et al. ................ 451/41 |
| 6,910,954 B2 * | 6/2005 | Kim et al. ..................... 451/60 |
| 6,936,543 B2 * | 8/2005 | Schroeder et al. .......... 438/692 |
| 2001/0008828 A1 | 7/2001 | Uchikura et al. | |
| 2002/0005017 A1 * | 1/2002 | Motonari et al. ............. 51/307 |
| 2002/0033382 A1 * | 3/2002 | Kaufman et al. ............. 216/89 |

(Continued)

FOREIGN PATENT DOCUMENTS

EP    1 081 200 A1    3/2001

(Continued)

OTHER PUBLICATIONS

Aksu, S., Doyle, F.M., *J. Electrochem. Soc.*, 149(6), G352-G361 (2002).

(Continued)

*Primary Examiner*—Michelle Estrada
(74) *Attorney, Agent, or Firm*—Chih-Sheng (Jason) Lin; Tristan A. Fuierer; Moore & Van Allen PLLC

(57) ABSTRACT

A CMP composition containing 5-aminotetrazole, e.g., in combination with oxidizing agent, chelating agent, abrasive and solvent and a method of use. Such CMP composition may be diluted during the CMP polish to minimize the occurrence of dishing or other adverse planarization deficiencies in the polished copper, even in the presence of substantial levels of copper ions in the CMP composition and at the copper/CMP composition interface during CMP processing.

40 Claims, 3 Drawing Sheets

U.S. PATENT DOCUMENTS

2002/0145127 A1* 10/2002 Kaufman et al. .......... 252/79.1
2003/0036339 A1*  2/2003 Bonner et al. ................ 451/41
2003/0100247 A1*  5/2003 Kim et al. .................... 451/60
2004/0025444 A1*  2/2004 Small et al. .................. 51/307

FOREIGN PATENT DOCUMENTS

EP    1 138 733  A2   10/2001
EP    1 138 734  A2   10/2001
EP    1628334    A1    2/2006

OTHER PUBLICATIONS

Hariharaputhiran, M., Zhang, J., Ramarajan, S., Keleher, J.J., Li, Y., Babu, S.V., *J. Electrochem. Soc.*, 147(10), 3820-3826 (2000).
Supplementary European Search Report for EP 03 81 2786 dated Nov. 30, 2005.

* cited by examiner

PASSIVATIVE CHEMICAL MECHANICAL POLISHING COMPOSITION FOR COPPER FILM PLANARIZATION

CROSS REFERENCE TO RELATED APPLICATIONS

This application is co-pending with U.S. patent application Ser. No. 11/117,282 filed Apr. 28, 2005 in the name of Jun Liu et al. for "Method of Passivating Chemical Mechanical Polishing Compositions for Copper Film Planarization Processes."

FIELD OF THE INVENTION

The present invention relates to a chemical mechanical polishing composition and to a method of using same for the polishing of wafer substrates having copper thereon, e.g., copper interconnects, electrodes, or metallization, as part of a microelectronic device structure.

DESCRIPTION OF THE RELATED ART

Copper is widely employed in semiconductor manufacturing as a material of construction for components of microelectronic device structures (e.g., contacts, electrodes, conductive vias, field emitter base layers, etc.), and it is rapidly becoming the interconnect metal of choice in semiconductor manufacturing due to its higher conductivity and increased electromigration resistance relative to aluminum and aluminum alloys.

Typically, the process scheme for utilizing copper in semiconductor manufacturing involves the damascene approach, wherein features are etched in a dielectric material. In the dual damascene process a single step is used to form both plugs and lines. Since copper has a propensity to diffuse into the dielectric material, leading to leakage between metal lines, barrier layers, such as Ta or TaN deposited by various deposition methods, are often used to seal the copper interconnects. Following deposition of the barrier layer material, a thin seed layer of copper is deposited on the barrier material via physical vapor deposition, followed by electrodeposition of copper to fill the features. The deposited copper must then be planarized to render it of suitable form to accommodate subsequent process steps in the fabrication of the finished semiconductor product, and in order to satisfactorily operate in the microcircuitry in which it is present. The planarization typically involves chemical mechanical polishing (CMP), using a CMP composition formulated for such purpose.

Due to the difference in chemical reactivity between copper and the barrier layer material, e.g. Ta and/or TaN, two chemically distinct slurries are often used in the copper CMP process. The Step I slurry is used to rapidly planarize the topography and remove the copper, with the Step I polish stopping at the barrier layer material. The Step II slurry removes the barrier layer material at a high removal rate and stops at the dielectric layer, or alternatively at a cap layer that has been applied to protect the dielectric.

Step I chemical mechanical polishing (CMP) compositions for planarization and polishing of copper typically are in the form of slurries containing an abrasive of suitable type, e.g., an abrasive selected from among silica, alumina, and other oxides and mineralic materials, in a solvent medium containing one or more solvent species, e.g., water, organic solvents, etc. Typically, Step I slurries have a high copper removal rate, and a copper to barrier material removal rate selectivity of greater than 100:1.

One type of CMP composition for planarizing copper surfaces includes an aqueous slurry of abrasive particles containing hydrogen peroxide as an oxidizing component and glycine as a chelating agent. Glycine has been found to react with solution phase $Cu^{+2}$ ions formed by the oxidation of the Cu metal to form a $Cu^{2+}$-glycine complex. The complexing of $Cu^{+2}$ ions through formation of a water soluble $Cu^{2+}$-glycine chelate assists in removal of Cu in protruded regions via a direct dissolution mechanism, and the $Cu^{2+}$-glycine complex decomposes hydrogen peroxide to yield hydroxyl radicals which have a higher oxidation potential than hydrogen peroxide itself.

In step I CMP slurries, the compound benzotriazole (BTA) is often included as a corrosion inhibitor. In theory, BTA

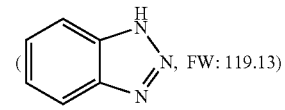

complexes with copper to form an insoluble Cu-BTA complex on the copper surface. The resulting insoluble protective film is meant to facilitate the planarization of the topography of the device structure being fabricated, since the recessed areas on the wafer surface are protected from dissolution, while mechanical action of the abrasive species on the protruding areas enables material removal and planarization to be carried out. Additionally, the Cu-BTA complex minimizes corrosion and preserves the functional integrity of the copper device structures for their intended use.

It is known that BTA functions well as a copper corrosion inhibitor in the absence of OH radicals. However, in step I copper CMP slurries containing hydrogen peroxide and glycine, the formation of highly oxidizing OH radicals under dynamic CMP conditions cannot be avoided, since copper metal is readily oxidized in such slurry environment. Experiments involving the addition of $Cu^{2+}$ to an $H_2O_2$/glycine/BTA system have shown that the presence of $Cu^{2+}$ increases the static etch rate of Cu dramatically, and at the same time, the Cu corrosion potential is shifted to less noble ranges.

The significance of this finding is that in the presence of $H_2O_2$ and glycine, BTA is not effective in protecting the low features of copper wafer surfaces during the CMP process, and thus undesired "dishing" and erosion occurs in high-density patterned areas on the wafer substrate.

Dishing occurs when too much copper is removed such that the copper surface is recessed relative to the barrier and/or dielectric surface of the semiconductor wafer. Dishing occurs when the copper and barrier material removal rates are disparate. Oxide erosion occurs when too much dielectric material is removed.

An alternative to the use of BTA as a corrosion inhibitor in CMP compositions includes 5-aminotetrazole (ATA), which is compatible with $H_2O_2$/glycine-based CMP compositions and effective to passivate copper surfaces when significant amounts of Cu ions are present in bulk solution and/or near the metal/solution interface during CMP processing.

During Step I, bulk copper is rapidly removed followed by the "soft landing" or "touchdown," whereby the polishing conditions are altered until the underlying barrier material is exposed, as determinable using an endpoint detection system such as an in situ rate monitor (ISRM). Although the endpoint has been detected, signaling the exposure of the barrier layer material, copper overburden remains which must be removed and as such, an over-polishing step is often performed. Unfortunately, the "soft landing" and the over-polishing steps often result in dishing and/or erosion into copper features and thus, loss of wafer surface planarity and uniformity.

Step I CMP slurries advantageously remove copper rapidly during the step I CMP process. However, during the soft landing and/or over-polish, this rapid rate of copper removal may become disadvantageous as various surface defects such as recesses, erosion, dishing, etc., form on the copper layer surface. The net result of the overly aggressive step I slurry during soft landing and/or over-polish is a wafer substrate having a non-uniform planar surface, which can render the wafer unusable.

It would therefore be a significant advance in the art to provide a method that overcomes the deficiencies of the prior art relating to the rapid rate of copper removal during the soft landing and/or overpolishing steps of the step I CMP process. Specifically, it would be an advance in the art to provide a method to reduce the static etch rate of copper, and hence copper corrosion, during the soft landing and/or overpolishing steps of the step I polishing process.

SUMMARY OF THE INVENTION

The present invention relates to a chemical mechanical polishing composition and method of using same for the polishing of microelectronic device substrates having copper thereon. In addition, the present invention further relates to a method for slowing down the rate of copper removal during the soft landing and/or overpolishing steps of the step I polishing process.

In one aspect, the invention relates to a method of polishing copper on a substrate having copper thereon, including:

(a) contacting copper on the substrate under chemical mechanical polishing (CMP) conditions for a sufficient time and under sufficient contacting conditions to planarize bulk copper with a first CMP composition;

(b) diluting the first CMP composition with solvent to produce a second CMP composition;

(c) contacting copper on the substrate with the second CMP composition under CMP conditions for a sufficient time and under sufficient contacting conditions effective to remove copper overburden and expose a barrier material layer.

In yet another aspect, the present invention relates to a method of manufacturing a microelectronic device, said method comprising:

(a) contacting copper on a substrate under CMP conditions for a sufficient time and under sufficient contacting conditions to planarize bulk copper with a first CMP composition, wherein the first CMP composition includes 5-aminotetrazole (ATA), at least one oxidizing agent, at least one chelating agent and solvent;

(b) diluting the first CMP composition with solvent to produce a second CMP composition; and (c) contacting copper on the substrate with the second CMP composition under CMP conditions for a sufficient time and under sufficient contacting conditions effective to remove copper overburden and expose a barrier material layer.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
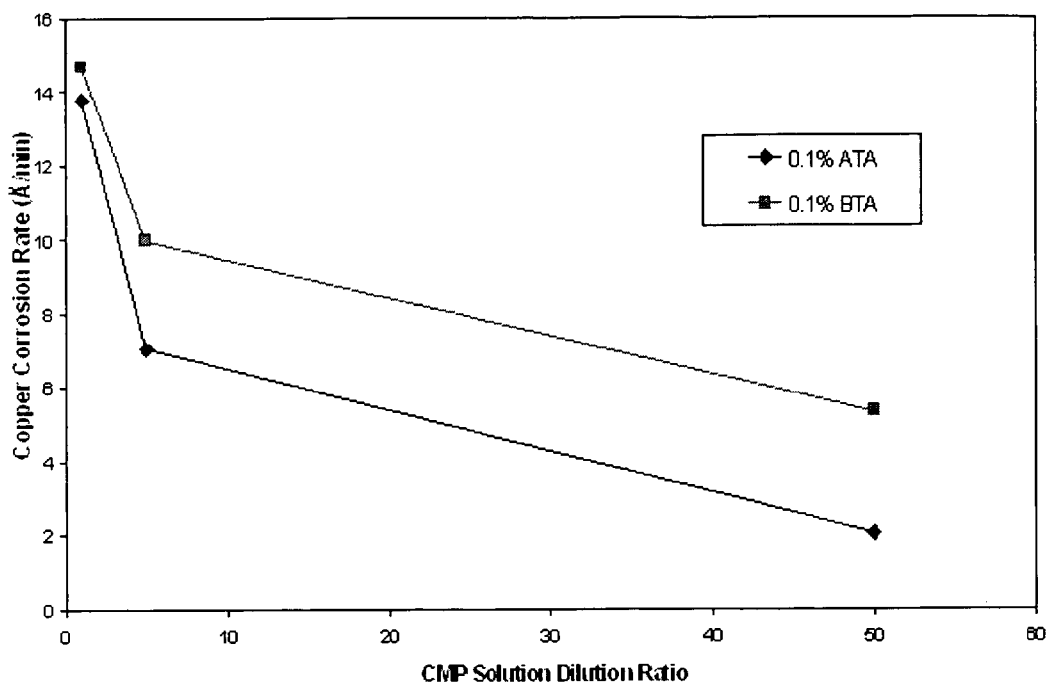
FIG. 1 is a plot of copper corrosion rate, in Angstroms per minute, as a function of 0.1% ATA/$H_2O_2$/glycine slurry dilution ratio (♦) and 0.1% BTA/$H_2O_2$/glycine slurry dilution ratio (■).

The present invention is based on the discovery that 5-aminotetrazole

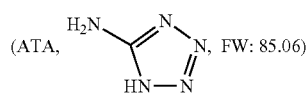

is unexpectedly effective as a replacement for BTA as a copper corrosion inhibitor in Step I CMP compositions for planarizing copper films. ATA is compatible with CMP compositions containing hydrogen peroxide as an oxidizer and glycine as a chelator. The ATA-containing CMP composition achieves active passivation of copper surfaces even when significant amounts of copper ions, e.g., $Cu^{2+}$ cations, are present in bulk solution and/or at the metal/solution interface during CMP processing.

The present invention is further based on the discovery that dilution of a CMP slurry composition during the soft landing and/or over polishing step of a CMP process achieves active passivation of exposed copper.

"Soft landing" or "touchdown," as defined herein, corresponds to some point in the Step I polishing process whereby the downforce pressure of the polisher may be decreased and/or the Step I composition altered to reduce dishing and/or erosion of the copper lines and plugs. Preferably, soft landing may be effectuated when the thickness of the layer of copper over the barrier material has been decreased to a range of from about 0.05 μm to about 0.4 μm.

"Over-polishing" is performed subsequent to soft landing to remove the copper overburden from the surface of the barrier material, while minimizing additional dishing or erosion of the copper features.

As used herein, "about" is intended to correspond to ±5% of the stated value.

"Microelectronic device," as used herein, corresponds to semiconductor substrates, flat panel displays, and microelectromechanical systems (MEMS). It is to be understood that the term "microelectronic device" is not meant to be limiting in any way and includes any substrate that will eventually become a microelectronic device.

As used herein, "suitability" to planarize bulk copper and remove copper overburden from a microelectronic device having said copper thereon corresponds to at least partial removal of said copper from the microelectronic device. Preferably, at least 90% of the copper is removed from the microelectronic device using the compositions of the invention, more preferably, at least 99% of the copper is removed.

As used herein, dilution of the CMP composition "subsequent" to the planarization of bulk copper corresponds to the soft landing step or immediately before the soft landing step.

The ATA-containing CMP compositions of the invention, in its broad contemplation, may be formulated with any suitable constituents, including any appropriate oxidizing agent(s), chelating agent(s), and corrosion inhibitor(s), abrasive media, solvent media, and optionally any suitable additives, adjuvants, excipients, etc., such as stabilizing agents, acids, bases (e.g., amines), surfactants, buffering agents, etc.

Oxidizing agents employed in the broad practice of the invention may be of any suitable type, including for example ferric nitrate, ferric ammonium oxalate, ferric ammonium citrate, permanganate salts (e.g., potassium permanganate), peroxyacids (e.g. peracetic acid), peroxoborate salts (e.g., potassium peroxoborate), urea-hydrogen peroxide, iodate salts (e.g., potassium iodate), perchlorate salts (e.g. tetramethylammonium perchlorate), persulfate salts, bromate salts, benzoquinone, chlorate salts, chlorite salts, hypochlorite salts, hypoiodite salts, oxybromide salts, percarbonate salts, periodate salts, ceric salts (e.g., ammonium ceric sulfate), chromate and dichromate compounds, cupricyanide and ferricyanide salts, ferriphenanthroline, ferripyridine and ferrocinium. Preferred oxidizers include peracetic acid, urea-hydrogen peroxide, di-t-butyl peroxide, benzyl peroxide, hydrogen peroxide and compatible mixtures including two or more of such oxidizer species.

Chelating agents in the CMP compositions of the invention may be of any appropriate type, including, for example: amino acids such as glycine, serine, proline, leucine, alanine, asparagine, aspartic acid, glutamine, valine, lysine, etc.; polyamine complexes and their salts, including ethylenediaminetetraacetic acid, N-hydroxyethylethylenediaminetriacetic acid, nitrilotriacetic acid, iminodiacetic acid, diethylenetriaminepentaacetic acid, and ethanoldiglycinate; polycarboxylic acids, including phthalic acid, oxalic acid, malic acid, succinic acid, mandelic acid, and mellitic acid; and compatible mixtures including two or more of the foregoing species. Preferred chelating agents include amino acids, with glycine being most preferred.

The corrosion inhibitor component in the CMP composition of the invention comprises ATA, and may additionally include other corrosion inhibitor components in combination with ATA, in specific embodiments of the invention. Such other corrosion inhibitor components may be of any suitable type, including for example, imidazole, benzotriazole, benzimidazole, amino, imino, carboxy, mercapto, nitro, alkyl, urea and thiourea compounds and derivatives, etc. Preferred inhibitors include tetrazoles and their derivatives, and the invention therefore contemplates the provision of ATA alone or in combination with other tetrazole (or other corrosion inhibitor) species, as the corrosion inhibitor in compositions according to the present invention.

ATA is employed in CMP compositions of the invention in any suitable concentration. Suitable concentrations of ATA in a specific formulation are readily empirically determinable within the skill of the art, based on the disclosure herein, to provide a CMP composition with suitable copper surface passivation characteristics even in CMP environments containing high levels of copper cations. In one preferred embodiment of the invention, the amount of ATA in the CMP composition is in a range of from about 0.001 to about 10% by weight, based on the total weight of the CMP composition, with an amount of ATA in a range of from about 0.01 to about 5% by weight being more preferred, and an amount of ATA in a range of from about 0.10 to about 1.5% by weight being most preferred, based on the same total weight basis, although greater or lesser percentages may be employed to advantage in specific applications within the broad scope of the present invention.

The abrasive may be of any suitable type, including, without limitation, metal oxides, silicon nitrides, carbides, etc. Specific examples include silica, alumina, silicon carbide, silicon nitride, iron oxide, ceria, zirconium oxide, tin oxide, titanium dioxide, and mixtures of two or more of such components in suitable form, such as grains, granules, particles, or other divided form. Alternatively, the abrasive may include composite particles formed of two or more materials, e.g., NYACOL® alumina-coated colloidal silica (Nyacol Nano Technologies, Inc., Ashland, MA). Alumina is a preferred inorganic abrasive and may be employed in the form of boehmite or transitional δ, θ or γ phase alumina. Organic polymer particles, e.g., including thermoset and/or thermoplastic resin(s), may be utilized as abrasives. Useful resins in the broad practice of the present invention include epoxies, urethanes, polyesters, polyamides, polycarbonates, polyolefins, polyvinylchloride, polystyrenes, polyolefins, and (meth)acrylics. Mixtures of two or more organic polymer particles may be used as the abrasive medium, as well as particles comprising both inorganic and organic components.

Bases may be optionally employed for pH adjustment in compositions of the invention. Illustrative bases include, by way of example, potassium hydroxide, ammonium hydroxide and tetramethylammoniumhydroxide (TMAH), tetraethylammonium hydroxide, trimethyl hydroxyethylammonium hydroxide, methyl tri (hydroxyethyl) ammonium hydroxide, tetra(hydroxyethyl)ammonium hydroxide, and benzyl trimethylammonium hydroxide.

Acids may also be optionally employed for pH adjustment in compositions of the invention. The acids used may be of any suitable type, including, by way of example, formic acid, acetic acid, propanoic acid, butanoic acid, pentanoic acid, isovaleric acid, hexanoic acid, heptanoic acid, octanoic acid, nonanoic acid, lactic acid, hydrochloric acid, nitric acid, phosphoric acid, sulfuric acid, hydrofluoric acid, malic acid, fumaric acid, malonic acid, glutaric acid, glycolic acid, salicylic acid, 1,2,3-benzenetricarboxylic acid, tartaric acid, gluconic acid, citric acid, phthalic acid, pyrocatechoic acid, pyrogallol carboxylic acid, gallic acid, tannic acid, and mixtures including two or more acids of the foregoing or other types.

Amines when present may be of any suitable type, including, by way of example, hydroxylamine, monoethanolamine, diethanolamine, triethanolamine, diethyleneglycolamine, N-hydroxylethylpiperazine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 4-(2-hydroxyethyl)morpholine, aminoethylpiperazine, and mixtures including two or more of the foregoing or other amine species.

Surfactants when optionally employed in compositions of the invention may be of any suitable type, including non-ionic, anionic, cationic, and amphoteric surfactants, and polyelectrolytes including, for example: salts of organic acids; alkane sulfates (e.g., sodium dodecyl sulfate); alkane sulfonates; substituted amine salts (e.g., cetylpyridium bromide); betaines; polyethylene oxide; polyvinyl alcohol; polyvinyl acetate; polyacrylic acid; polyvinyl pyrrolidone; polyethyleneimine; and esters of anhydrosorbitols, such as those commercially available under the trademarks Tween® and Span®, as well as mixtures including two or more of the foregoing or other surfactant species.

The pH of CMP compositions of the invention may be at any suitable value that is efficacious for the specific polishing operation employed. In one embodiment, the pH of the CMP composition may be in a range of from about 2 to about 11, more preferably in a range of from about 2 to about 7, and most preferably in a range of from about 3 to about 6.

The solvents employed in CMP compositions of the invention may be single component solvents or multicomponent solvents, depending on the specific application. In one embodiment of the invention, the solvent in the CMP composition is water. In another embodiment, the solvent comprises an organic solvent, e.g., methanol, ethanol, propanol, butanol, ethylene glycol, propylene glycol, glycerin, etc. In yet another embodiment, the solvent comprises a water-organic solvent solution. A wide variety of solvent types and specific solvent media may be employed in the general practice of the invention to provide a solvating/suspending medium in which the abrasive is dispersed and in which the other components are incorporated to provide a composition of appropriate character, e.g., of slurry form, for application to the platen of the CMP unit to provide a desired level of polishing of the copper on the wafer substrate.

In one embodiment, the invention provides a Step I CMP composition useful for chemical mechanical polishing of substrates having copper thereon, e.g., copper interconnects, metallization, device structural elements, etc., in which the composition includes hydrogen peroxide, glycine, ATA, and solvent.

In another embodiment, the invention provides a Step I CMP composition useful for chemical mechanical polishing of substrates having copper thereon, e.g., copper interconnects, metallization, device structural elements, etc., in which the composition includes hydrogen peroxide, glycine, ATA, abrasive and solvent.

In another embodiment, the CMP composition of the invention is an aqueous abrasive composition, and includes an aqueous medium, abrasive, ATA, $H_2O_2$ and glycine, wherein ATA, $H_2O_2$ and glycine have the following composition by weight, based on the total weight of the composition:

| | |
|---|---|
| ATA | 0.001-10 wt. % |
| $H_2O_2$ | 0.1-30 wt. % |
| Glycine | 0.1-25 wt. % |
| Water | 35-99.8 wt. %. |

In a further specific illustrative embodiment, the CMP composition comprises the following components by weight, based on the total weight of the composition:

| | |
|---|---|
| ATA | 0.001-10 wt. % |
| $H_2O_2$ | 0.1-30 wt. % |
| Glycine | 0.1-25 wt. %. |
| Abrasive | 0.1-30 wt. % |
| Water | 5-99.7 wt. % | with the total wt. % of all components in the composition totaling to 100 wt. %.

The CMP compositions of the invention may be provided as a single package formulation or a multi-part formulation that is mixed at the point of use or in a storage tank upstream of the tool. The advantage of a multi-part formulation resides in its extended shelf life relative to single-package formulations. A single package formulation is more susceptible to decomposition and change of its properties over time, in relation to a multi-part formulation, due to the presence of the oxidizer in the single-package CMP composition. The concentrations of the single-package formulation or the individual packages of the multi-part formulations may be widely varied in specific multiples, i.e., more dilute or more concentrated, in the broad practice of the invention, and it will be appreciated that the CMP compositions of the invention can variously and alternatively comprise, consist or consist essentially of any combination of ingredients consistent with the disclosure herein.

In one embodiment, each single ingredient of the CMP composition is individually delivered to the polishing table for combination at the table, to constitute the CMP composition for use. In another embodiment, the CMP composition is formulated as a two-part composition in which the first part comprises abrasive and corrosion inhibitor in aqueous medium, and the second part comprises oxidizing agent and chelating agent. In still another embodiment, the CMP composition is formulated as a two-part composition in which the first part comprises abrasive, corrosion inhibitor and chelating agent in an aqueous medium, and the second part comprises the oxidizer. In all of these various embodiments, the mixing of ingredients or parts to form the final composition occurs at the point of use, with mixing at the polishing table, polishing belt or the like, in an appropriate container shortly before reaching the polishing table, or at the CMP composition manufacturer and/or supplier.

Accordingly, another aspect of the invention relates to a kit including, in one or more containers, the components adapted to form the compositions of the invention as described hereinabove.

The copper CMP composition of the invention may be utilized in a conventional manner in the CMP operation, by application of the CMP composition to the copper surface on the microelectronic device substrate in a conventional fashion, and polishing of the copper surface may be carried out using a conventional polishing element such as a polishing pad, polishing belt, or the like.

The CMP composition of the invention is advantageously employed to polish surfaces of copper elements on microelectronic device substrates, without the occurrence of dishing or other adverse planarization deficiencies in the polished copper, even when significant amounts of copper ions, e.g., $Cu^{2+}$ ions, are present in the bulk CMP slurry composition and/or at the copper/CMP slurry interface during CMP processing.

Step I CMP slurries advantageously remove copper rapidly during the step I CMP process. However, as the step I process enters the soft landing and/or overpolishing phases, this rapid rate of copper removal may become disadvantageous as various surface defects such as recesses, erosion, dishing, etc., form on the copper layer surface.

To limit the overly aggressive CMP slurry composition during the soft landing and/or overpolishing steps of the Step I polishing step, the Step I CMP slurry of the invention may be diluted in a serial fashion. Accordingly, another embodiment of the present invention relates to a process of using a CMP composition to efficiently and uniformly planarize copper-containing microelectronic device substrates. Following rapid removal of the bulk copper layer using a more concentrated CMP composition, the CMP composition is diluted, either by in-line mixing or directly at the platen, to form a diluted CMP composition(s) for the soft landing and over-polishing steps. The diluting media most preferably corresponds to the solvent of the Step I CMP composition of the invention.

To demonstrate the effect of dilution on copper corrosion rates, Step I CMP compositions were diluted twice in a step-wise fashion and the Cu corrosion rates determined using electrochemical methods. As defined herein, "Cu corrosion rate" is equivalent to "static etch rate." By way of example, the initial Step I CMP compositions included 5 wt. % $H_2O_2$, 6 wt. % glycine, 1 wt. % abrasive, varying concentrations of ATA, and the balance water. To simulate the acceleration effect of corrosive copper ions in the solution, i.e., the formation of the $Cu^{2+}$-glycine complex which decomposes $H_2O_2$ to form the highly oxidizing OH radicals, 0.5 wt. % $CuSO_4 \cdot 5H_2O$ was added to the initial Step I CMP compositions. In each case, the Step I CMP composition including ATA was compared to a Step I CMP composition including 5 wt. % $H_2O_2$, 6 wt. % glycine, 1 wt. % abrasive, 0.1 wt. % BTA, and the balance water The initial Step I CMP composition (hereinafter Slurry1) was diluted step-wise with water to yield a second CMP slurry (1 part Slurry1 to 5 parts water; hereinafter Slurry2), and a third CMP slurry (1 part Slurry1 to 50 parts water; hereinafter Slurry3). The Cu corrosion rates in Angstroms per minute, were measured and the average Cu corrosion rate plotted as a function of CMP slurry dilution using both a linear and logarithmic scale.

Importantly, the number of serial dilutions of Slurry1, i.e., the most concentrated CMP slurry, is not limited to the aforementioned two dilutions. The number of dilutions depend on the desired end result of the Step I CMP polish and may vary from one step-wise dilution to ten step-wise dilutions. Alternatively, the dilution may be effectuated in a continuous manner whereby diluting solvent is continuously added to the CMP slurry during the soft-landing and/or over-polishing steps. In yet another alternative, Slurry1 is not diluted per se, but rather diluted CMP compositions are prepared for delivery of clean, diluted chemistries to the tool subsequent to the polish using Slurry1.

Figure 2:
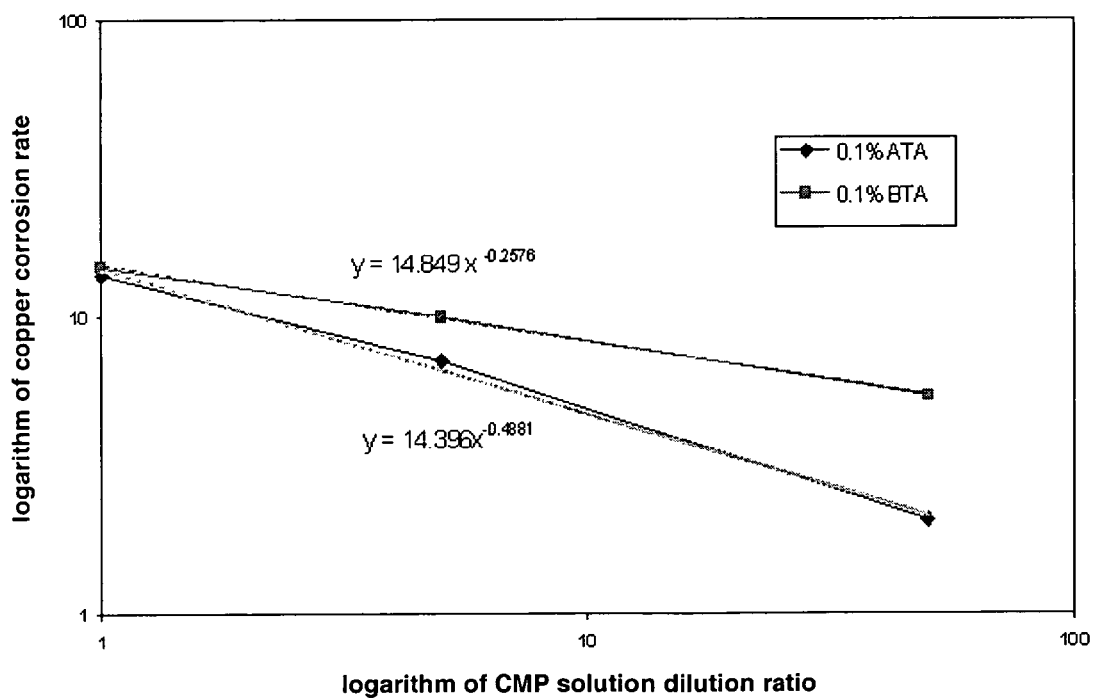
FIG. 2 is a logarithmic plot of the copper corrosion rate as a function of the ATA/$H_2O_2$/glycine slurry dilution ratio and the BTA/$H_2O_2$/glycine slurry dilution ratio illustrated in FIG. 1.

FIGS. 1 and 2 correspond to linear and logarithmic plots of the average Cu corrosion rate as a function of CMP slurry dilution for a Step I CMP slurry having an ATA concentration of 0.1 wt. %, respectively. Non-linear regression of the best-fit straight line in FIG. 2 yields a power relation between corrosion rate and slurry dilution of $y=14.396x^{-0.4881}$.

Figure 3:
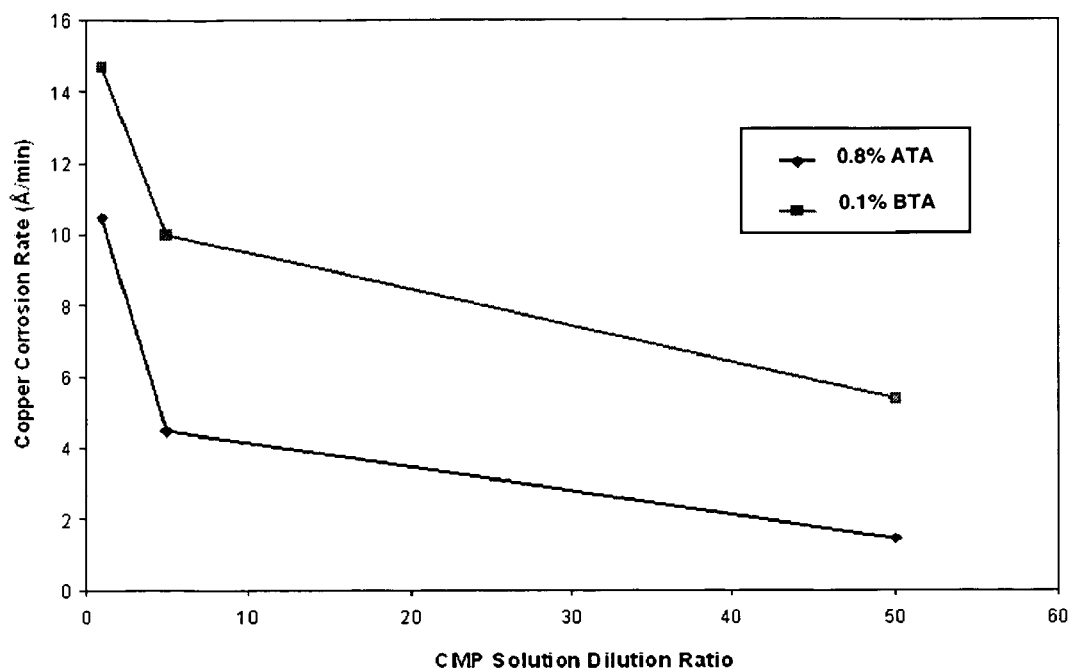
FIG. 3 is a plot of copper corrosion rate, in Angstroms per minute, as a function of 0.8% ATA/$H_2O_2$/glycine slurry dilution ratio (♦) and 0.1% BTA/$H_2O_2$/glycine slurry dilution ratio (■).
Figure 4:
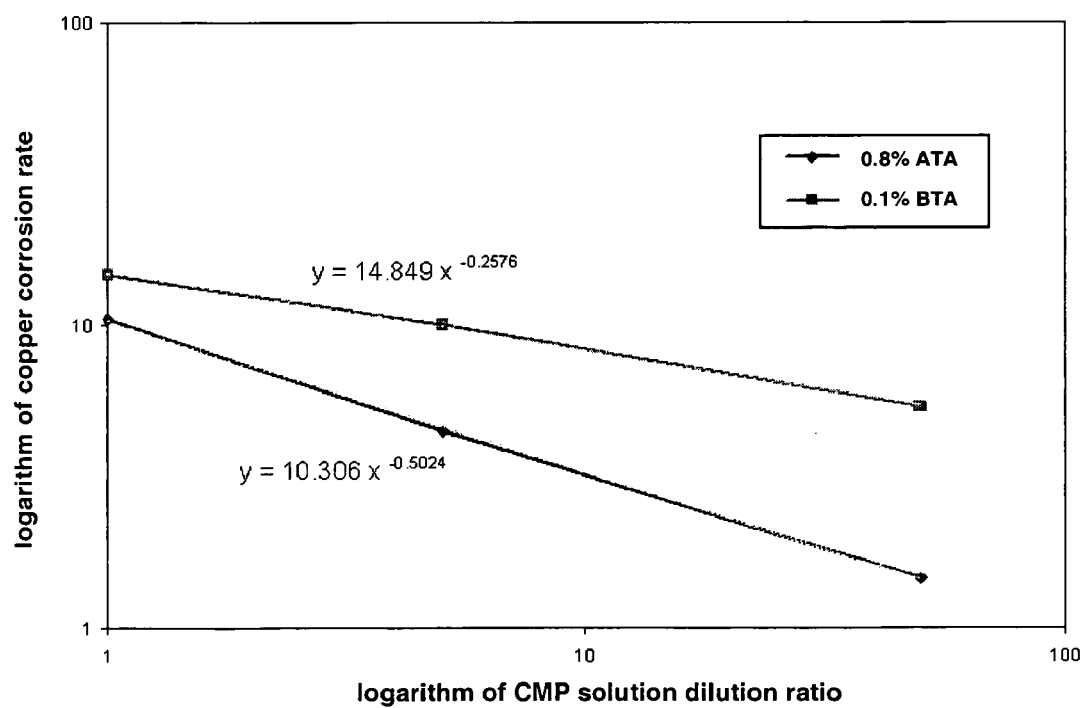
FIG. 4 is a logarithmic plot of the copper corrosion rate as a function of the ATA/$H_2O_2$/glycine slurry dilution ratio and the BTA/$H_2O_2$/glycine slurry dilution ratio illustrated in FIG. 3.

FIGS. 3 and 4 correspond to linear and logarithmic plots of the average Cu corrosion rate as a function of CMP slurry dilution for a Step I CMP slurry having an ATA concentration of 0.8 wt. %, respectively. Non-linear regression of the best-fit straight line in FIG. 4 yields a power relation between corrosion rate and slurry dilution of $y=10.306x^{-0.5024}$.

Figure 5:
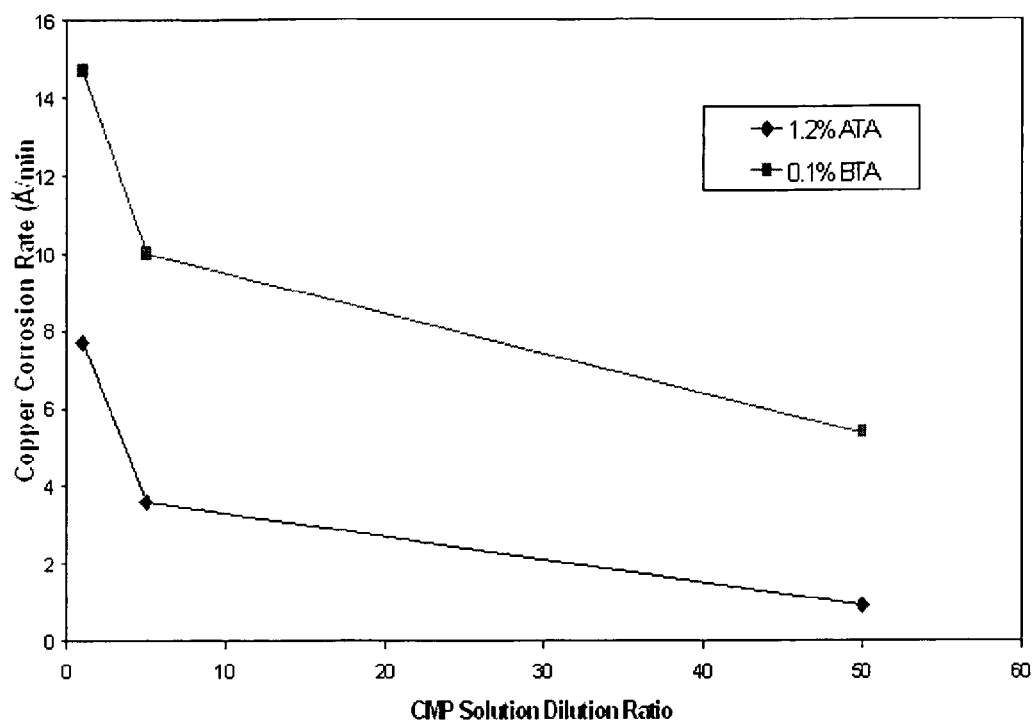
FIG. 5 is a plot of copper corrosion rate, in Angstroms per minute, as a function of 1.2% ATA/$H_2O_2$/glycine slurry dilution ratio (♦) and 0.1% BTA/$H_2O_2$/glycine slurry dilution ratio (■).
Figure 6:
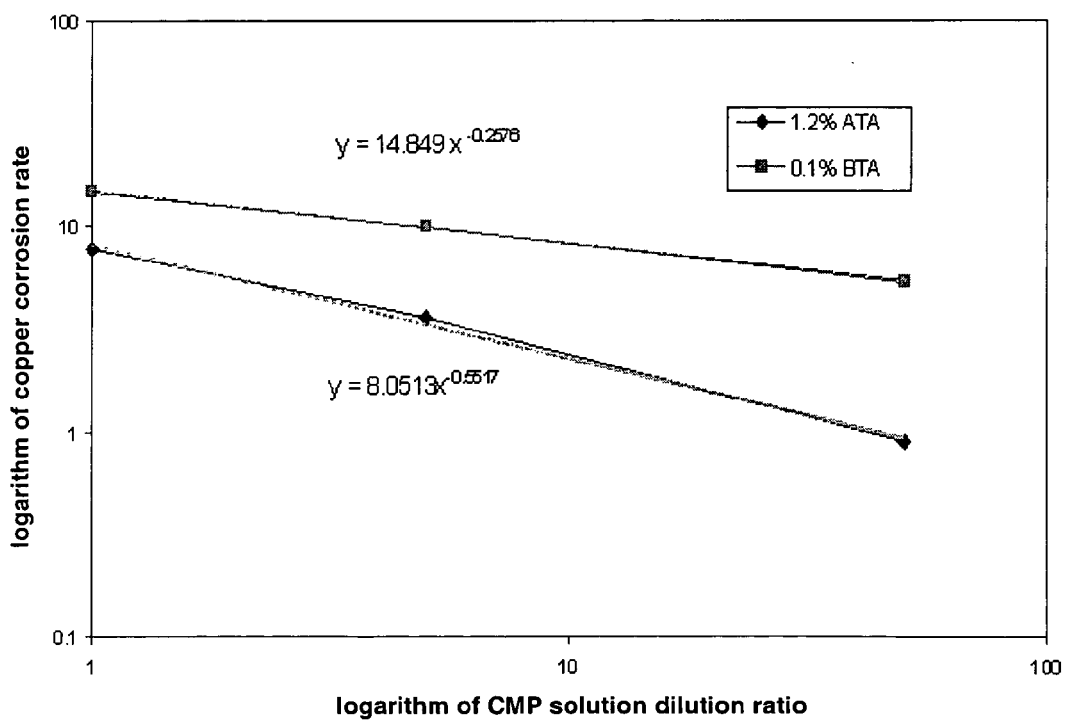
FIG. 6 is a logarithmic plot of the copper corrosion rate as a function of the ATA/$H_2O_2$/glycine slurry dilution ratio and the BTA/$H_2O_2$/glycine slurry dilution ratio illustrated in FIG. 5.

FIGS. 5 and 6 correspond to linear and logarithmic plots of the average Cu corrosion rate as a function of CMP slurry dilution for a Step I CMP slurry having an ATA concentration of 1.2 wt. %, respectively. Non-linear regression of the best-fit straight line in FIG. 6 yields a power relation between corrosion rate and slurry dilution of $y=8.0513x^{-0.5517}$.

In each example, the copper corrosion rate decreases with increasing slurry dilution. This may prove advantageous during the soft-landing and over-polishing steps to slow the copper corrosion rate and concomitantly minimize the dishing and erosion of the copper lines and plugs. Further, compared to compositions including BTA, ATA leads to a lower overall corrosion rate as well as a more rapid corrosion decrease with increasing dilution, as evidenced by the slopes of the regression lines.

These power relationships between copper corrosion rate and slurry dilution provide a means to control the static etch of Cu during Step I CMP polishing. In order to achieve acceptable planarization of the wafer surface at an efficient etch rate with the minimum amount of dishing, Slurry1 may be diluted at some point prior to the soft-landing, during the soft-landing and/or during the over-polishing steps of the Step I CMP polish, as readily determined by one skilled in the art. As defined herein, "bulk layer" represents the copper layer that is rapidly removed by the Step I CMP composition of the invention, e.g., Slurry1, and "residual layer" represents the copper layer that remains following the removal of the bulk layer, including the copper overburden, which is intended to be removed at a slower rate, e.g., by Slurry2, Slurry3, etc. By diluting the overly aggressive Slurry1 at the appropriate point in the CMP polish, polishing defects such as dishing and erosion are substantially eliminated.

The diluting solvent, e.g., water, may be delivered to the polishing table at the appropriate time and in the appropriate amount based on the regression equation specific to the slurry composition of choice, as readily determinable by one skilled in the art. In practice, Slurry1 may be diluted in a serial manner and the Cu corrosion rate of each composition measured using Tafel or some equivalent measurement. Thereafter, a logarithmic plot of the Cu corrosion rate as a function of the slurry dilution may be plotted and the non-linear regression equation calculated. Using the regression equation and knowledge of the wafer to be polished, e.g., thickness of the film, removal rate, etc., one skilled in the art may determine the appropriate time and in the appropriate amount of diluting solvent to deliver to the polishing table to slow the static etch rate of copper to a rate that minimizes the formation of polishing defects such as dishing.

The CMP composition of the invention may be diluted in a serial manner to effectuate substantial removal of the residual layer of copper while simultaneously minimizing dishing and erosion of the copper lines and plugs, as readily determined by one skilled in the art. As defined herein, "substantial removal" corresponds to at least 80%, preferably at least 90%, most preferably at least 95% of the residual layer of copper is removed using the series of Step I CMP compositions.

It is also contemplated herein that the dilution process may be automated whereby the polishing table and a programmable logic control (PLC) unit may be communicatively connected and the regression equation for the CMP slurry of choice input into the PLC. At the appropriate time, the appropriate amount of diluting solvent will be delivered to the polishing table, as controlled by the PLC.

Following completion of the Step I CMP process, the platen and substrate are rinsed with solvent. Preferably, the solvent is the same as that used in the Step I CMP compositions described herein, e.g., water. The rinse time may be in a range from about 5 sec to about 30 sec, preferably about 10 sec to about 20 sec. Thereafter, the wafer substrate may be transferred to another platen for Step II polishing thereon.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of polishing copper on a substrate having copper thereon, including:
    (a) contacting copper on the substrate under chemical mechanical polishing (CMP) conditions effective to planarize bulk copper with a first CMP composition;
    (b) diluting the first CMP composition with solvent to produce a second CMP composition;
    (c) contacting copper on the substrate with the second CMP composition under CMP conditions effective to remove copper overburden and expose a barrier material layer.

2. The method of claim 1, wherein the first CMP composition includes 5-aminotetrazole (ATA), at least one oxidizing agent, at least one chelating agent and solvent.

3. The method of claim 2, wherein the at least one oxidizing agent comprises at least one compound selected from the group consisting of ferric nitrate, ferric ammonium oxalate, ferric ammonium citrate, permanganate salts, peroxyacids, peroxoborate salts, urea-hydrogen peroxide, iodate salts, perchlorate salts, persulfate salts, bromate salts, benzoquinone, chlorate salts, chlorite salts, hypochlorite salts, hypoiodite salts, oxybrornide salts, percarbonate salts, periodate salts, ceric salts, chromate compounds, dichrornate compounds, cupricyanide salts, ferricyanide salts, ferriphenanthroline, ferripyridine, ferrocinium, peracetic acid, di-t-butyl peroxide, benzyl peroxide, hydrogen peroxide, and combinations thereof.

4. The method of claim 2, wherein the at least one chelating agent comprises at least one chelant selected from the group consisting of glycine, serine, proline, leucine, alanine, asparagine, aspartic acid, glutamine, valine, lysine, ethylenediaminetetraacetic acid, N-hydroxyethylethylenediaminetriacetic acid, nitrilotriacetic acid, iminodiacetic acid, diethylenetriaminepentaacetic acid, ethanoldiglycinate, phthalic acid, oxalic acid, malic acid, succinic acid, mandelic acid, mellitic acid, and combinations thereof.

5. The method of claim 2, wherein the at least one chelating agent comprises glycine.

6. The method of claim 2, wherein the first CMP composition further comprises another corrosion inhibitor in combination with ATA, wherein said another corrosion inhibitor comprises at least one inhibitor selected from the group consisting of imidazole, benzotriazole, benzimidazole, tetrazole, tetrazole derivatives, amino, imino, carboxy, mercapto, nitro, alkyl, urea and thiourea compounds and derivatives thereof.

7. The method of claim 2, wherein the first CMP composition further comprises abrasive, wherein the abrasive comprises at least one abrasive selected from the group consisting of silica, alumina, silicon carbide, silicon nitride, iron oxide, ceria, zirconium oxide, tin oxide, titanium dioxide, alumina-coated colloidal silica, thermoset resins, thermoplastic resins, and mixtures of two or more of such components in suitable form.

8. The method of claim 2, wherein the first CMP composition further comprises a pH adjustment agent.

9. The method of claim 1, wherein the first CMP composition has a pH in a range of from about 2 to about 11.

10. The method of claim 2, wherein the first CMP composition has a pH in a range of from about 2 to about 11.

11. The method of claim 1, wherein the solvent comprises water.

12. The method of claim 2, wherein the solvent comprises water.

13. The method of claim 2, wherein the first CMP composition further comprises abrasive, and wherein ATA, the at least one oxidizing agent, the at least one chelating agent, and solvent have the following concentrations by weight, based on total weight of the composition:

| | |
|---|---|
| ATA | 0.001-10 wt. % |
| oxidizing agent | 0.1-30 wt. % |
| chelating agent | 0.1-25 wt. % |
| solvent | 5-99.7 % wt. %. |

14. The method of claim 1, wherein the first CMP composition is diluted with solvent in a dilution range from about 1:2 to about 1:100.

15. The method of claim 1, wherein the first CMP composition is diluted with solvent in a dilution range from about 1:5 to about 1:50.

16. The method of claim 1, wherein a static etch rate of copper using the first CMP composition is greater than the static etch rate of copper using the second CMP composition.

17. The method of claim 1, wherein said CMP conditions comprise use of a polishing element on said copper, wherein said polishing element includes at least one element selected from the group consisting of polishing pads and polishing belts.

18. The method of claim 1, further comprising diluting the second CMP composition with solvent to produce a third CMP composition and contacting copper on the substrate with the third CMP composition under CMP conditions for a sufficient time and under sufficient contacting conditions to substantially remove the copper overburden and expose the barrier material layer.

19. The method of claim 1, wherein a static etch rate of copper using the first CMP composition is from about 2 to about 10 times more rapid that the static etch rate of copper using the second CMP composition.

20. The method of claim 1, wherein dilution is effectuated in steps.

21. The method of claim 1, wherein dilution is effectuated continuously.

22. The method of claim 1, wherein the second CMP composition minimizes copper dishing and erosion at the onset of exposure to the barrier material layer.

23. The method of claim 1, wherein the barrier layer material comprises tantalum.

24. The method of claim 8, wherein the pH adjustment agent comprises a species selected from the group consisting of an acid and a base.

25. The method of claim 2, wherein the first CMP composition further comprises a surfactant.

26. The method of claim 1, wherein the first CIVIP composition is diluted to produce the second CMP composition by in-line mixing.

27. The method of claim 1, wherein the first CMP composition is diluted to produce the second CMP composition directly at a CMP platen.

28. The method of claim 1, wherein the first CMP composition is diluted to produce the second CMP composition prior to soft-landing.

29. The method of claim 1, wherein the first CMP composition is diluted to produce the second CMP composition during soft-landing.

30. The method of claim 1, wherein the first CMP composition is diluted to produce the second CMP composition during over-polishing.

31. A process for manufacturing a semiconductor device comprising polishing copper on a substrate according to the method of claim 1, and further comprising including said substrate in a semiconductor device.

32. The method of claim 1, wherein the solvent comprises a species selected from the group consisting of water, methanol, ethanol, propanol, butanol, ethylene glycol, propylene glycol, glycerin, and combinations thereof.

33. The method of claim 1, wherein the first CMP composition includes 5-aminotetrazole (ATA).

34. The method of claim 1, wherein the first CMP composition includes at least one oxidizing agent.

35. The method of claim 1, wherein the first CMP composition includes at least one chelating agent.

36. The method of claim 1, wherein the first CMP composition includes solvent.

37. The method of claim 2, wherein the oxidizing agent comprises hydrogen peroxide.

38. The method of claim 6, wherein the another corrosion inhibitor comprises at least one inhibitor selectedd from the group consisting of imidazole, benzotriazole, benzimidazole, tetrazole, and tetrazole derivatives.

39. The method of claim 1, wherein the barrier layer material comprises tantalum notride.

40. The method of claim 1, wherein the solvent comprises water.

* * * * *